(12) United States Patent
Iwai et al.

(10) Patent No.: US 7,263,010 B2
(45) Date of Patent: Aug. 28, 2007

(54) SEMICONDUCTOR MEMORY DEVICE WITH TEST CIRCUIT

(75) Inventors: Hitoshi Iwai, Fujisawa (JP); Shinji Miyano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 11/194,539

(22) Filed: Aug. 2, 2005

(65) Prior Publication Data
US 2006/0221729 A1 Oct. 5, 2006

(30) Foreign Application Priority Data
Apr. 4, 2005 (JP) .............................. 2005-107696

(51) Int. Cl.
*G11C 29/00* (2006.01)
(52) U.S. Cl. ...................................... 365/200; 365/201
(58) Field of Classification Search ................ 365/200, 365/189.04, 230.04, 230.05, 189.05, 201
See application file for complete search history.

(56) References Cited

U.S. PATENT DOCUMENTS 5,295,101 A * 3/1994 Stephens et al. ............ 365/200
6,714,466 B2 * 3/2004 Park et al. .................. 365/200
2004/0093539 A1 * 5/2004 Chadwick et al. .......... 714/718
2004/0153925 A1 * 8/2004 Ronza et al. ................ 714/724
2004/0225912 A1 * 11/2004 Ronza et al. ................... 714/5

FOREIGN PATENT DOCUMENTS

JP 2000-260198 9/2000
JP 2002-184197 6/2002

* cited by examiner

*Primary Examiner*—Anh Phung
*Assistant Examiner*—Douglas S. King
(74) *Attorney, Agent, or Firm*—Oblon, Spivak, McClelland, Maier & Neustadt, P.C.

(57) ABSTRACT

A semiconductor memory device includes a memory cell array including a plurality of memory blocks, a plurality of redundancy sections respectively provided for the plurality of memory blocks and configured to be substituted for defective memory cells, a test circuit that carries out a test on the memory cell array and outputs defective data, first and second memory circuit that temporarily store the defective data, a first write circuit that writes the defective data alternately in the first and second memory circuits, a first read circuit that reads the defective data alternately from the first and second memory circuits, a plurality of third memory circuits respectively provided for the plurality of memory blocks, that store the defective data, and a second write circuit that writes defective data read by the first read circuit in a third memory circuit corresponding to a memory block in which an error occurred.

19 Claims, 11 Drawing Sheets

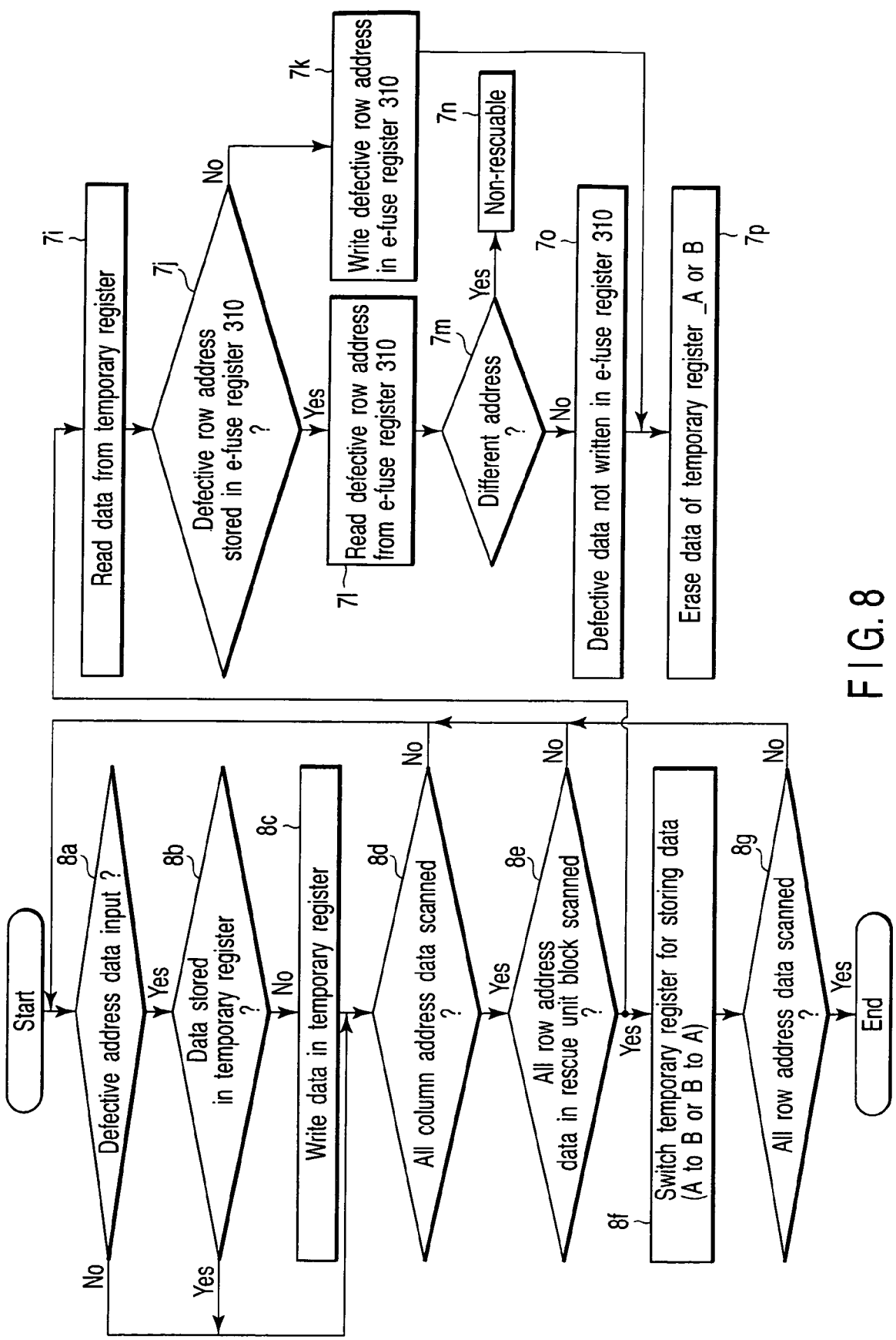
F I G. 8

SEMICONDUCTOR MEMORY DEVICE WITH TEST CIRCUIT

CROSS-REFERENCE TO RELATED APPLICATIONS

This application is based upon and claims the benefit, of priority from prior Japanese Patent Application No. 2005-107696, filed Apr. 4, 2005, the entire contents of which are incorporated herein by reference.

BACKGROUND OF THE INVENTION

1. Field of the Invention

The present invention relates to a semiconductor memory device, and more specifically, a semiconductor memory device equipped with a BIST (built-in self test) circuit.

2. Description of the Related Art

Recently years, as LSIs (large-scale integrated circuit) have been advanced, semiconductor memory devices equipped with mass-storage memories such as DRAM (dynamic random access memory) and SRAM (static random access memory) have been developed. Such semiconductor memory devices are equipped with a BIST circuit.

The BIST circuit has such a structure that the testing function of the semiconductor memory device that is conventionally carried out with a memory tester is incorporated in the form of a circuit on the same chip. The BIST circuit has the functions of inputting test patterns (such as a memory control signal, test address data and data to be written) to devices in a chip, and judge data read from devices in a chip by comparing them with each other whether the data passes or fails.

In the meantime, the electrical fuse (e-fuse) recently began to be utilized for a redundancy of a memory device, as a substitute for the optical fuse (o-fuse), which is conventionally used to rescue memories. The advantages of using the e-fuse are: operations that require blow of fuse with a laser or the like, become unnecessary; memories can still be rescued with use of a tester or the like, not only in the form of wafer but also still after being packaged; and the chip area is expected to be reduced in the future as compared to the case of the o-fuse.

At present, there are some memory devices that use e-fuses only in place of o-fuses. Further, there are many memory devices that use o-fuses and e-fuses in combination to utilize merits of each of these. In memory devices that use o-fuses and e-fuses in combination, the rescue of a defective memory cell detected in the wafer test is assigned to the o-fuses (, which will be called main rescue, hereinafter) and the rescue of a defective cell found in the package test, which is carried out after the assembly, is assigned to the e-fuses (, which will be called secondary rescue, hereinafter).

Here, in the case where there is no memory medium that can store data outside the chip (for example, a memory tester), it is necessary to stop the test each time the address of a defective cell is output during the test by the BIST circuit, rescue the cell using an e-fuse and then re-start the test to continue. Therefore, it is only natural that the time required for the test is longer as compared to the test that judges if a cell passes or fails, and thus the cost for the test is increased accordingly.

Further, the BIST circuit usually carries out many sorts of memory tests. In some cases, data are written in or read from each memory cell a number of times during one memory cell test. Consequently, there is a high possibility that the address of the same defective cell is output in a series of memory tests by the BIST circuit, which makes the test time even longer.

As a technique related to the case of the above-mentioned type, there has been proposed a technique of reducing the memory capacity for storing defective data. (See Jpn. Pat. Appln. KOKAI Publication No. 2002-184197.)

BRIEF SUMMARY OF THE INVENTION

According to an aspect of the present invention, there is provided a semiconductor memory device comprising: a memory cell array including a plurality of memory blocks, each memory block including a plurality of memory cells arranged in matrix; a plurality of redundancy sections respectively provided for the plurality of memory blocks and configured to be substituted for defective memory cells; a test circuit that carries out a test on the memory cell array and outputs defective data; first and second registers that temporarily store the defective data; a first write circuit that writes the defective data alternately in the first and second registers; a first read circuit that reads the defective data alternately from the first and second registers; a plurality of third registers respectively provided for the plurality of memory blocks, that store the defective data; and a second write circuit that writes defective data read by the first read circuit in a third register corresponding to a memory block in which an error occurred.

BRIEF DESCRIPTION OF THE SEVERAL VIEWS OF THE DRAWING

FIG. 8 is a flowchart illustrating the operation of the control circuit 304 in a column first scanning mode;

DETAILED DESCRIPTION OF THE INVENTION

Figure 1:
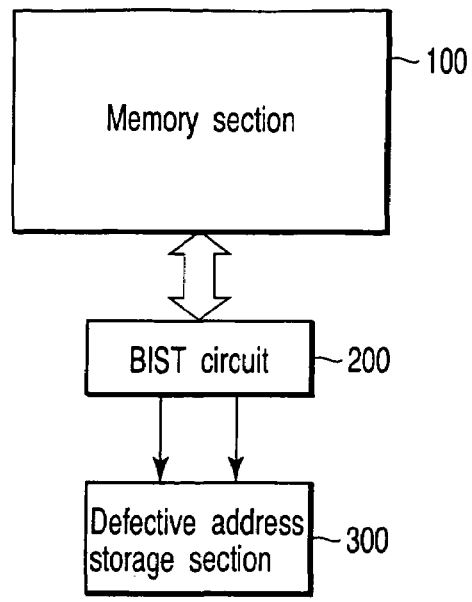
FIG. 1 is a block diagram showing the structure of a semiconductor memory device according to the first embodiment of the present invention.

Embodiments of the present invention will now be described with reference to accompanying drawings. In the following descriptions, elements having the same function and structure are designated by the same reference numerals, and the explanations therefor will be repeated only when it is necessary.

First Embodiment

FIG. 1 is a block diagram showing the structure of a semiconductor memory device according to the first embodiment of the present invention. The semiconductor memory device includes a memory section 100, a BIST circuit 200 and a defective address storage section 300. The semiconductor memory device is composed of, for example, a semiconductor integrated circuit such that the memory section 100, BIST circuit 200 and defective address storage section 300 are mounted on the same substrate.

The memory section 100 represents a block that functions as a memory, and it includes a memory cell array 101, a row decoder, a column decoder, a sense amplifier circuit and the like. In this embodiment, the memory section 100 is made of, for example, a DRAM.

Further, the memory section 100 includes a redundancy circuit. The redundancy circuit serves to rescue a memory cell array that contains a defective memory cell, and in this embodiment, it replaces a defective memory cell in the memory cell array 101. During this process, in order to change the connection between the defective memory cell and redundancy circuit, an optical fuse (to be called o-fuse hereinafter) and an electrical fuse (to be called e-fuse hereinafter) are used.

O-fuses serve to switch between conductive and non-conductive based on whether or not a fuse is blown optically using a laser or the like. o-fuses are made of, for example, a metal. E-fuses serve to switch between conductive and non-conductive based on whether or not a fuse is blown electrically. E-fuses are made of, for example, a MOS (metal oxide semiconductor) transistor. Advantages of using the e-fuse are: operations that require blow of fuse with a laser or the like in the case of the o-fuse become unnecessary; memories can still be rescued with use of a tester or the like, not only in the form of wafer but also still after being packaged; and the chip area is expected to be reduced as compared to the case of the o-fuse.

Figure 2:
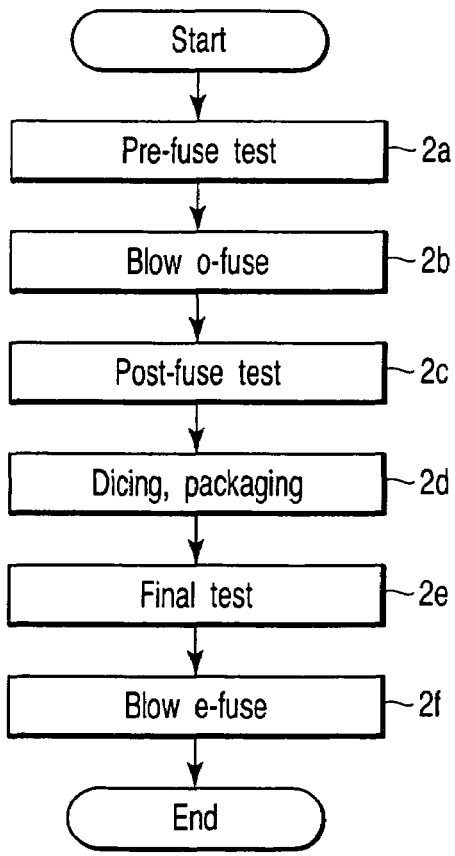
FIG. 2 is a flowchart illustrating an example of the shipment test.

Here, an example of the shipment test of the semiconductor memory device will now be described. FIG. 2 is a flowchart showing the example of the shipment test.

First, a wafer is subjected to a pre-fuse test (step 2a). The pre-fuse test is a test designed to rescue a defective memory cell with a redundancy circuit into a good product. Next, in order to replace the defective memory cell with a redundancy circuit, the o-fuse is blown with a laser (step 2b).

Next, the wafer is subjected to a post-fuse test (step 2c). The post-fuse test is a test designed to detect a defective memory cell that is created after the rescue with the redundancy, and select it out as a defective product.

After that, the wafer is diced into chips, and the diced chips are packaged (step 2d). Then, a semiconductor memory device obtained after the packaging is subjected to the final test (step 2e).

Subsequently, in order to replace the defective memory cell with a redundancy circuit, the e-fuse is blown (step 2f). In this embodiment, the defective memory cell detected by the test carried out while in the wafer state is rescued by means of the o-fuse. On the other hand, the secondary defective memory cell detected by the test carried out after the packaging is rescued by means of the e-fuse, which can be easily blown with use of a tester or the like.

Figure 3:
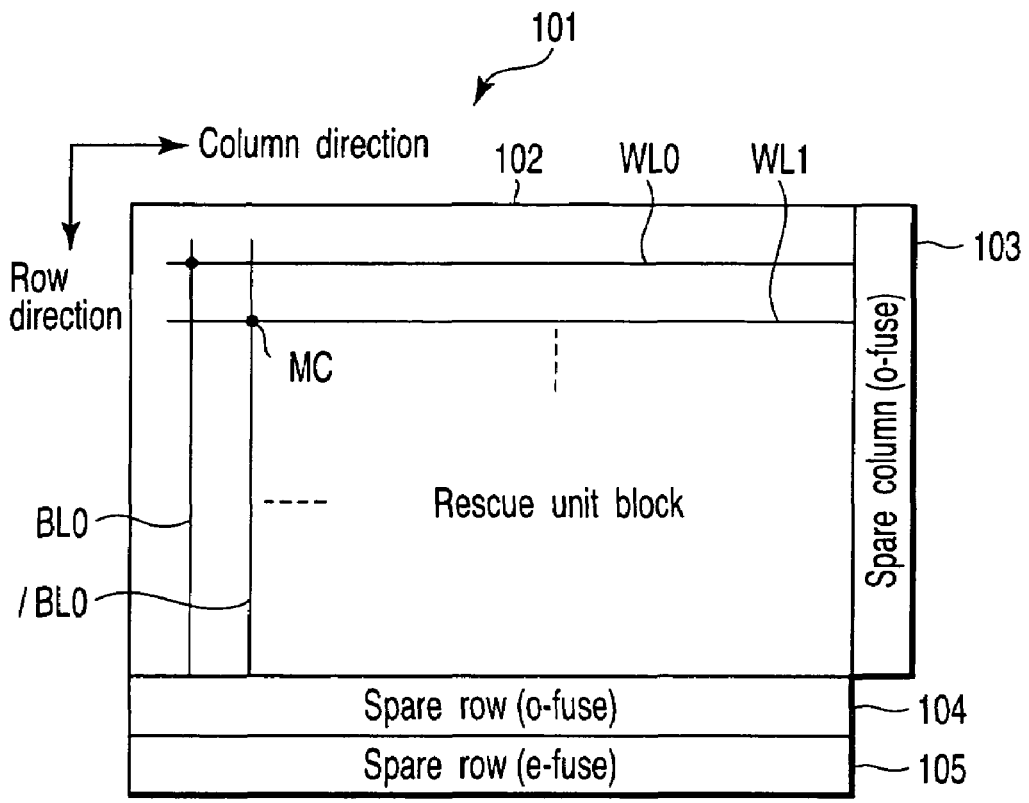
FIG. 3 is a schematic diagram showing the structure of a memory section 100 shown in FIG. 1.
Figure 3:
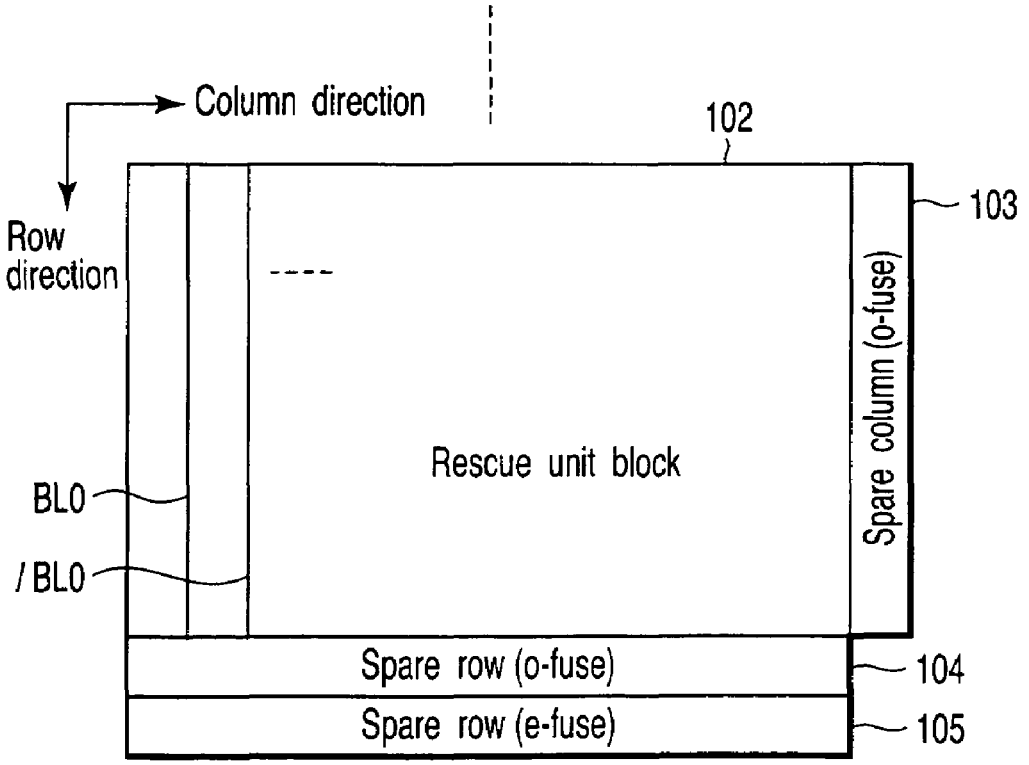

FIG. 3 is a schematic diagram showing the structure of the memory section 100 shown in FIG. 1. It should be noted that peripheral circuits (such as decoder and sense amplifier circuit) are omitted from the illustration.

The memory cell array 101 includes a plurality of memory cells MC arranged in matrix. The memory cell array 101 is provided with a plurality of bit line pairs BL0 to BLm,/BL0 to BLm. The memory cell array 101 is further provided with a plurality of word lines WL0 to WLn.

The memory cell array 101 included in the memory section 100 is divided into a plurality of blocks 102 for each unit of rescue (to be called rescue unit blocks hereinafter).

Each rescue unit block 102 is provided with a redundancy circuit 103 including an o-fuse (to be called spare column (o-fuse) hereinafter), which has the same structure as one column in a rescue unit (, which includes one bit line pair BL,/BL in the rescue unit and memory cells connected to the bit pair BL,/BL). A plurality of word lines WL provided for the respective rescue unit block 102 are connected to the spare column (o-fuse) 103.

Further, each rescue unit block 102 is provided with a redundancy circuit 104 including an o-fuse (to be called spare row (o-fuse) hereinafter), which has the same structure as one row (, which includes one word line WL and memory cells connected to the word line WL). A plurality of bit lines pairs BL,/BL provided for the respective rescue unit block 102 are connected to the spare row (o-fuse) 104.

Furthermore, each rescue unit block 102 is provided with a redundancy circuit 105 including an e-fuse (to be called spare row (e-fuse) hereinafter), which has the same structure as one row. A plurality of bit lines pairs BL,/BL provided for the respective rescue unit block 102 are connected to the spare row (e-fuse) 105.

The number of spare rows or spare columns is usually far less then that of regular rows or regular columns, respectively. When the number of spares is increased, the capability for rescue is improved; however, the chip area is increased at the same time. Under such circumstances, the number of spare rows or spare columns is several times or several tens of times less than that of regular rows or regular columns, respectively.

Further, in the case of the first embodiment in which the main rescue is delegated to the o-fuses, whereas the secondary rescue is delegated to the e-fuses, there are even a fewer number of e-fuses required for one rescue unit, and therefore in many cases, a deficiency can be attended merely by spares of one of rows and columns. This embodiment will be described in connection with an example of the structure where one e-fuse is assigned to one rescue unit.

Figure 4:
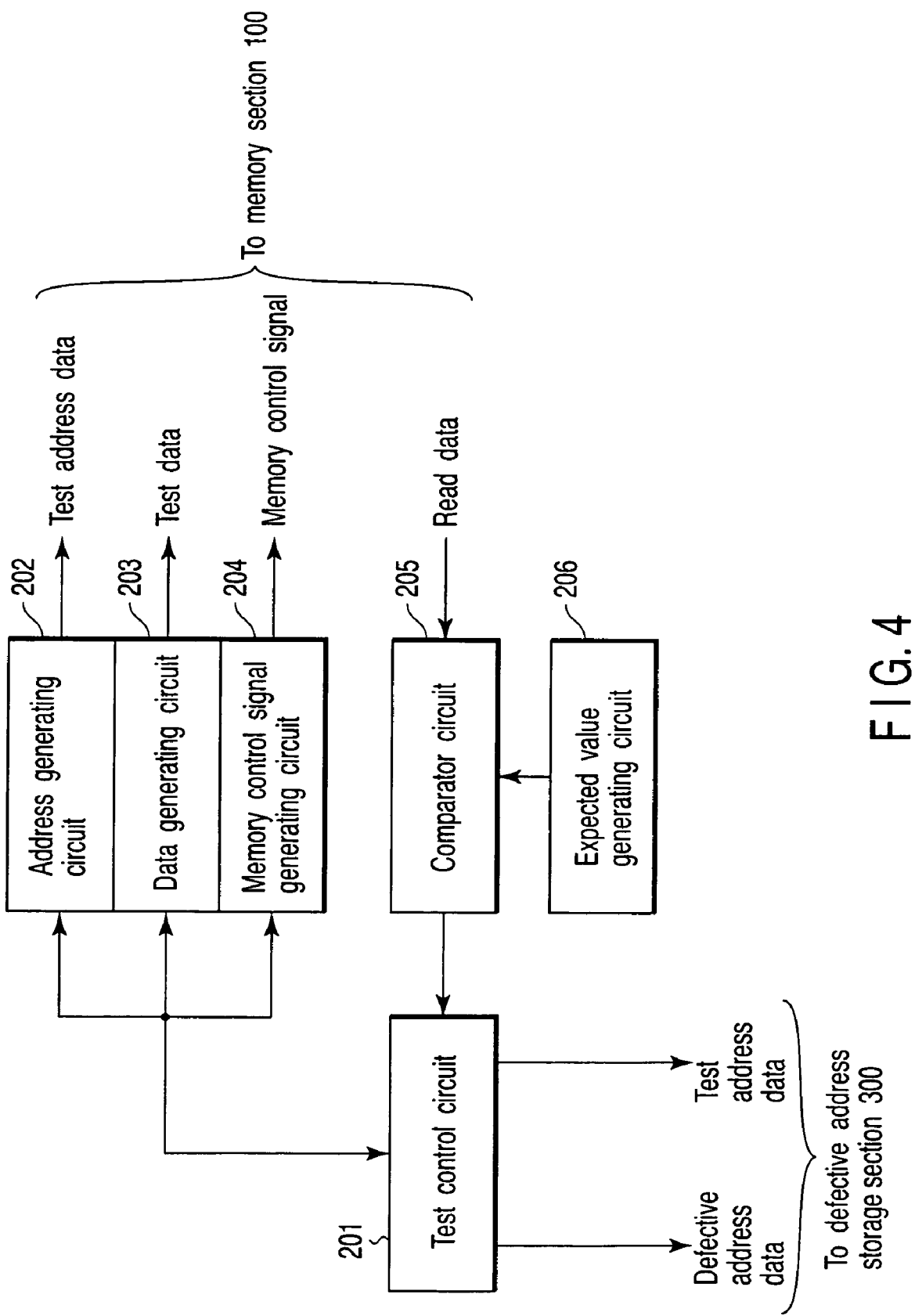
FIG. 4 is a block diagram showing the structure of a BIST circuit 200 shown in FIG. 1.

Next, an example of the BIST circuit 200 will now be described. FIG. 4 is a block diagram showing the structure of the BIST circuit 200 shown in FIG. 1. The BIST circuit 200 is capable of executing two types of scanning modes: one is a row first scan mode, in which it scans in a row direction, first, (that is, row address data is incremented or decremented) and then column address data is incremented or decremented; and the other is a column first scan mode, in which it scans in a column direction, first, (that is, column address data is incremented or decremented) and then row address data is incremented or decremented.

Further, the BIST circuit executes a number of types of memory tests, based on which the BIST circuit can even more accurately detect defective memory cells.

The BIST circuit 200 includes a test control circuit 201, an address generating circuit 202, a data generating circuit 203, a memory control signal generating circuit 204, a comparator circuit 205 and an expected value generating circuit 206.

The address generating circuit 202 generates test address data. In the row first scan mode, the address generating circuit 202 first increments or decrements row address data, and then increments or decrements column address data.

In the column first scan mode, the address generating circuit 202 first increments or decrements column address data, and then increments or decrements row address data. The user can arbitrarily select one of the row first scan mode and column first scan mode. The test address data is supplied to the memory section 100.

The data generating circuit 203 generates test data. The test data is supplied to the memory section 100. The memory control signal generating circuit 204 generates a memory control signal used to control the test of the memory section 100. The memory control signal is supplied to the memory section 100.

The comparator circuit 205 compares read data read out from the memory section 100 and an expected value generated from the expected value generating circuit 206. Then, the comparator circuit 205 judges whether the bit is good or not.

The test control circuit 201 controls each of the circuits in the BIST circuit 200. The test control circuit 201 supplies test address data and defective address data to the defective address memory storage section 300. Defective address data contains the block address of a rescue unit block in which a defective bit occurred, and a defective row address in the rescue unit block. It should be noted here that when the redundancy circuit of an e-fuse is a spare column, defective address data contains a defective column address in the rescue unit block.

Figure 5:
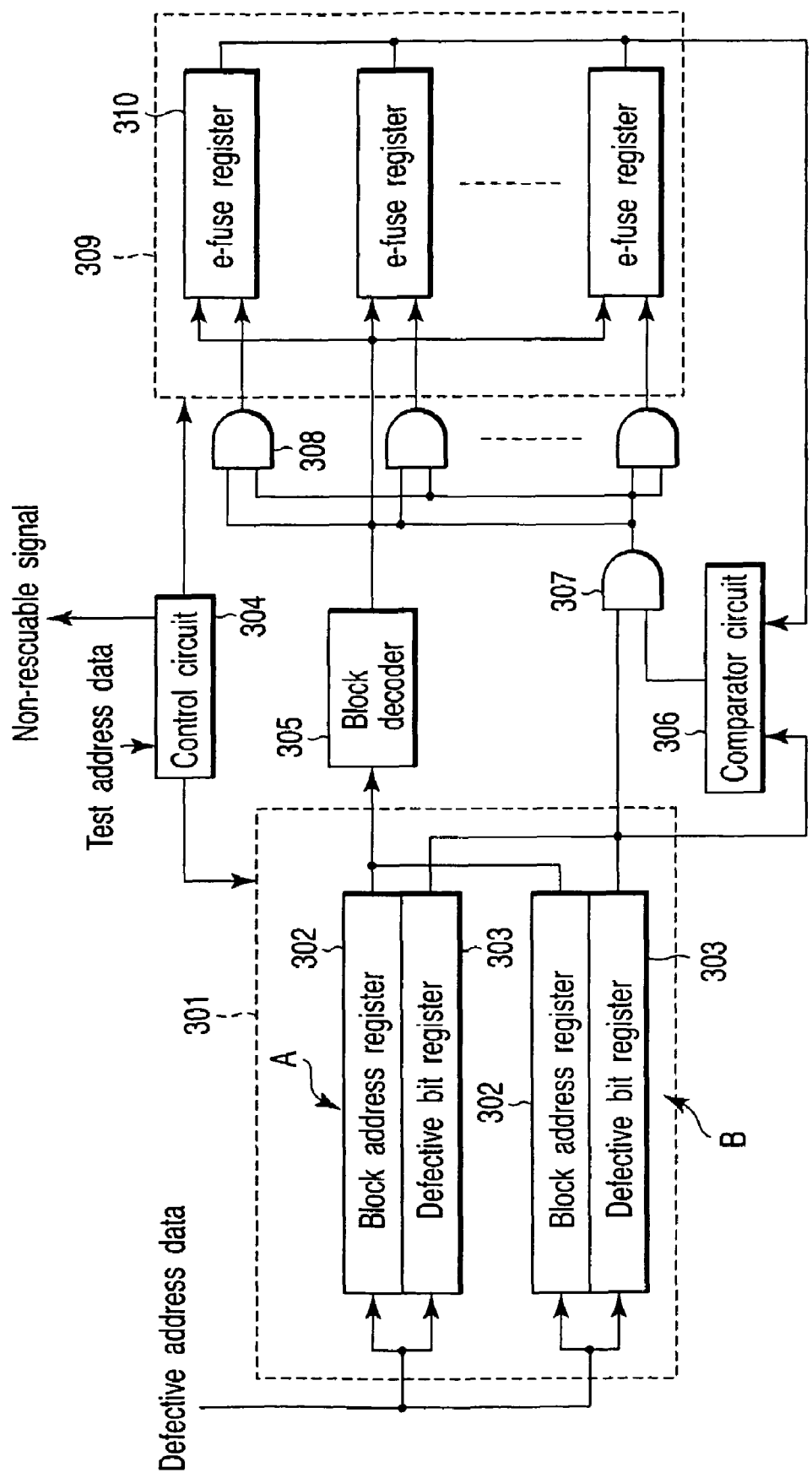
FIG. 5 is a block diagram showing the structure of a defective address storage section 300 shown in FIG. 1.

Next, the defective address storage section 300 will now be described. FIG. 5 is a block diagram showing the structure of the defective address storage section 300 shown in FIG. 1. The defective address storage section 300 includes a temporary register 301, a control circuit 304, a block decoder 305, a comparator circuit 306, an AND circuit 307, a plurality of AND circuits 308 and a fuse register 309.

The temporary register 301 includes a temporary register_A and a temporary register_B. The temporary register_A includes a block address register 302 that stores a block address indicating the address of a rescue unit block in which an error occurred, and a defective bit register 303 that stores a defective row address indicating the row address of a defective bit in a rescue unit block. The temporary register_B has the same structure as that of the temporary register_A.

The fuse register 309 includes a plurality of e-fuse registers 310, whose number corresponds to that of rescue unit blocks. The fuse register 309 stores a defective row address for each rescue unit block.

The block decoder 305 decodes a block address, and selects an e-fuse register 310 based on the result of the decoding.

The comparator circuit 306 compares a defective row address stored in the temporary register 301 and a defective row address stored in the e-fuse register 310 of the rescue unit block corresponding to the defective row address. Then, the circuit 306 judges whether or not the defective row address stored in the temporary register 301 is already present in the e-fuse register 310.

Figure 6:
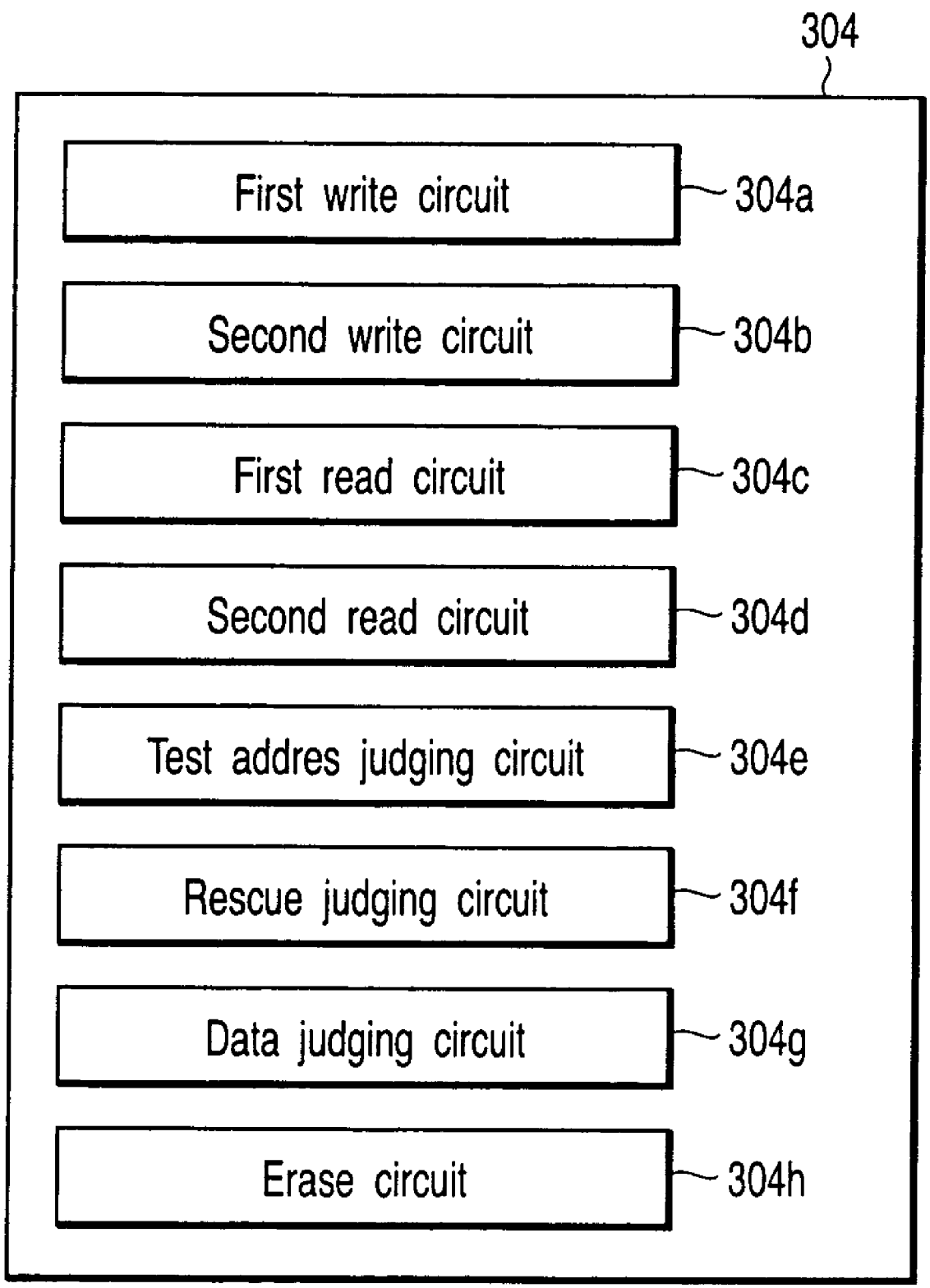
FIG. 6 is a block diagram showing the structure of a control circuit 304 shown in FIG. 5.

The control circuit 304 controls the temporary register 301 and the fuse register 309. FIG. 6 is a block diagram showing the structure of the control circuit 304 shown in FIG. 5.

The control circuit 304 includes a first write circuit 304a, a second write circuit 304b, a first read circuit 304c, a second read circuit 304d, a test address judging circuit 304e, a rescue judging circuit 304f, a data judging circuit 304g and an erase circuit 304h.

The first write circuit 304a writes a defective address data output from the BIST circuit 200 in the temporary register_A or the temporary register_B. The second write circuit 304b writes the defective row address stored in the temporary register 301 in an e-fuse register 310.

The first read circuit 304c reads a defective address data stored in the temporary register_A or the temporary register_B. The second read circuit 304d reads the defective row address from the e-fuse register 310.

The test address judging circuit 304e judges the progressing state of the test based on the test address data generated by the BIST circuit 200. The rescue judging circuit 304f judges whether or not the semiconductor memory device can be rescued.

The data judging circuit 304g judges whether or not the defective row address is stored in the respective e-fuse register 310. The erase circuit 304h, after the defective row address is written in the respective register 310, erases the defective address data stored in the temporary register_A or the temporary register_B.

Figure 7:
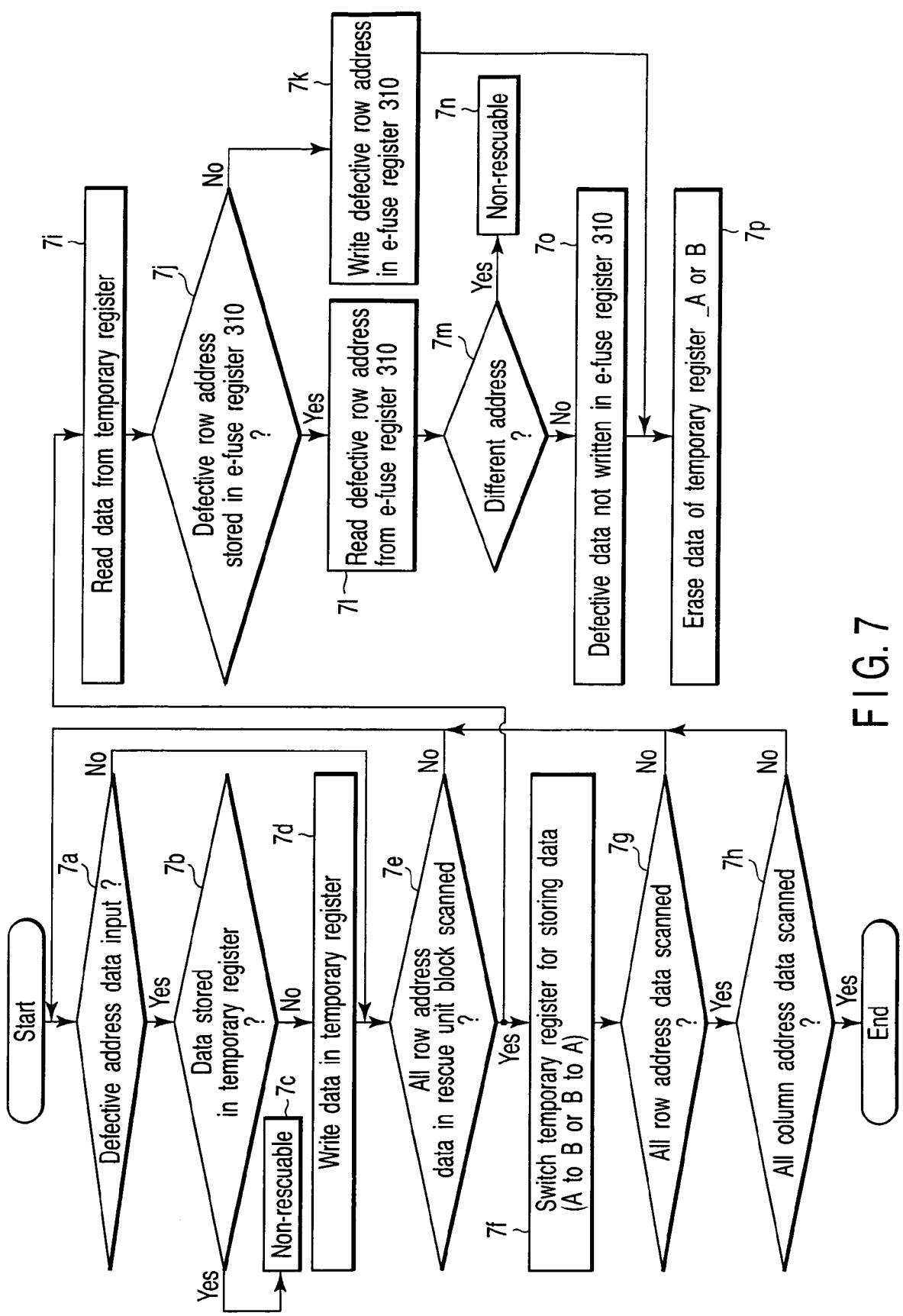
FIG. 7 is a flowchart illustrating the operation of the control circuit 304 in a row first scanning mode.

The operation of the semiconductor memory device having the above-described structure will now be described. First, the row first scan mode will be discussed. FIG. 7 is a flowchart illustrating the operation of the control circuit 304 in the row first scanning mode.

The control circuit 304 monitors whether or not defective address data is input from the BIST circuit 200 (step 7a). In the case where defective address data has been input from the BIST circuit 200, the rescue judging circuit 304f judges whether or not the defective address data is stored in the temporary register_A or the temporary register_B currently used to store defective address data (step 7b).

In the case where the defective address data is stored in the respective temporary register, the rescue judging circuit 304f judges that the device is not rescuable (step 7c). More specifically, there is only one spare row (e-fuse) for one rescue unit block, and therefore in the case where two defective memory cells of row addresses different from each other are present in one column of a rescue unit block, the semiconductor memory device cannot be rescued. In this case, for example, the rescue judging circuit 304f outputs to an external unit a non-rescuable signal indicating that the device cannot be rescued. Alternatively, the rescue judging circuit 304f may control the BIST circuit 200 to finish the test.

In the case where the defective address data is not stored in the respective temporary register, the first write circuit 304a write defective address data in the temporary register_A or the temporary register_B (step 7d). Then, the test address judging circuit 304e judges whether or not all of the test row address data in the rescue unit block in which the error occurred, have been scanned (step 7e).

In the case where not all of the test row address data in the rescue unit block have been scanned, the operation of the control circuit 304 returns to step 7a, where it is monitored whether or not defective address data has been input from the BIST circuit 200. The BIST circuit 200 increments or decrements the test row address data.

In the case where all of the test row address data in the rescue unit block have been scanned, the control circuit 304 switches the temporary register that stores defective address data, from A to B, or B to A (step 7f).

Further, in parallel with the operation of switching the temporary register that stores defective address data to another register, the first read circuit 304c reads the defective address data stored in the temporary register_A or the temporary register_B (step 7i). During this period, the block address stored in the block address register 302 is input to the block decoder 305. The block decoder 305 selects a corresponding e-fuse register 310 based on the block address.

Next, the data judging circuit 304g judges whether or not defective row address is already stored in the respective e-fuse register 310 selected by the block decoder 305 (step 7j). In the case where defective address data is not stored, the second write circuit 304b writes defective row address in the e-fuse register 310 (step 7k).

More specifically, the block decoder 305 outputs a signal of a high level and the comparator circuit 306 outputs a signal of a high level. In this manner, the second write circuit 304b writes the defective row address in the respective e-fuse register 310 via the AND circuit 307 and AND circuits 308.

After that, the erase circuit 304h erases the defective address data stored in the temporary register_A or the temporary register_B (step 7p).

In the case where the defective address data is stored in the step 7j, the second read circuit 304d reads the defective row address from the respective e-fuse register 310 (step 7l). The read defective row address is input to the comparator circuit 306. The comparator circuit 306 compares the defective row address read from the e-fuse register 310 and the defective row address read from the respective temporary register with each other (step 7m).

In the case where the two defective row addresses are different from each other, the rescue judging circuit 304f judges that the device cannot be rescued (step 7n). To explain, since there are two defective memory cells of different row addresses from each other in one rescue unit, the semiconductor memory device cannot be rescued. Then, the rescue judging circuit 304f outputs a non-rescuable signal to the external unit.

On the other hand, in the case where the two defective row addresses are the same as each other, the second write circuit 304b does not write the defective row address read from the temporary register in the e-fuse register 310. More specifically, the comparator circuit 306 supplies a low-level signal to the AND circuit 307. With this operation, the defective row address transferred from the temporary register is not written in the e-fuse register 310.

After that, the erase circuit 304h erases the defective address data stored in the temporary register_A or the temporary register_B (step 7p).

Then, the control circuit 304 repeats the above-described operation until all of the test row address data in the memory cell array 101 have been scanned (step 7g). At the same time, the BIST circuit 200 increments or decrements the test row address data.

Further, the control circuit 304 repeats the above-described operation until all of the test column address data have been scanned (step 7h). At the same time, the BIST circuit 200 increments or decrements the test column address data.

Next, the column first scan mode will now be described. In the column first scan mode, memory cells MC that are connected to the same word line can be rescued by one spare row (e-fuse) 105. FIG. 8 is a flowchart illustrating the operation of the control circuit 304 in the column first scanning mode.

The control circuit 304 monitors whether or not defective address data is input from the BIST circuit 200 (step 8a). In the case where defective address data has been input from the BIST circuit 200, the rescue judging circuit 304f judges whether or not the defective address data is stored in the temporary register_A or the temporary register_B currently used to store defective address data (step 8b).

In the case where the defective address data is not stored in the respective temporary register, the first write circuit 304a write defective address data in the temporary register_A or the temporary register_B (step 8c). Then, the test address judging circuit 304e judges whether or not all of the test column address data have been scanned (step 8d).

In the case where not all of the test row address data in the rescue unit block have been scanned, the operation of the control circuit 304 returns to step 8a, where it is monitored whether or not defective address data has been input from the BIST circuit 200. The BIST circuit 200 increments or decrements the test column address data.

In the case where all of the test column address data have been scanned, the test address judging circuit 304e judges whether or not all of the test row address data in the rescue unit block, have been scanned (step 8e).

In the case where not all of the test row address data in the rescue unit block have been scanned, the operation of the control circuit 304 returns to step 8a, where it is monitored whether or not defective address data has been input from the BIST circuit 200. The BIST circuit 200 increments or decrements the test row address data.

In the case where all of the test row address data in the rescue unit block have been scanned, the control circuit 304 switches the temporary register that stores defective address data, from A to B, or B to A (step 8f).

Further, in parallel with the operation of switching the temporary register that stores defective address data to another register, the control circuit 304 writes the defective row address in a respective e-fuse register 310. This operation is the same as that described with reference to FIG. 7.

Then, the control circuit 304 repeats the above-described operation until all of the test row address data in the memory cell array 101 have been scanned (step 8g). At the same time, the BIST circuit 200 increments or decrements the test row address data.

It should be pointed out here that the number of the spare row (e-fuse) is 1, which is overwhelmingly less as compared to that of the regular rows, as described above. In other words, the time required for defective row address transferred from a temporary register to be compared with defective row address already stored in an e-fuse register 310 and then written in the e-fuse 310 is shorter than the time for carrying out a memory test. Therefore, the operation of the memory test will not be adversely affected, but it becomes possible to compare data between a temporary register and an e-fuse register 310 and transfer data between them.

As described above in detail, according to this embodiment, it is possible to store defective address data indicating the address of a memory cell MC in which an error occurred, in the semiconductor memory device. Thus, even if some error occurs during a memory test, the test need not be aborted. Further, it is possible to carry out rescues by using a redundancy circuit after not only one type of memory test but also several types of memory tests are all finished.

In the embodiment, one of the two temporary registers is used to store defective address data output from the BIST circuit 200, and the other is used to write defective address data in a fuse register. With this arrangement, it is possible to attain the processing time for comparing defective address data of a temporary register and that of a fuse register with each other.

Further, by comparing defective address data of a temporary register and that of a fuse register with each other, the present embodiment can avoid storing of the same address data in the fuse register. Therefore, even in the case where the BIST circuit repeatedly carries out tests on the same memory cell MC, the same defective address data will not be stored in a fuse register.

Furthermore, a plurality of defective address data that can be rescued by the same redundancy circuit are stored as one defective data item. In this manner, the number of fuse registers used for storing defective address data can be minimized.

Still furthermore, of defective column address and defective row address of a defective bit, only the defective row address is stored in an e-fuse register 310. In this manner, the memory data of the fuse register 309 can be minimized, thereby making it possible to reduce the area of the circuit of the fuse register 309.

Still furthermore, whether or not the device can be rescued is judged at an appropriate timing during a memory test. Therefore, in case where a device is judged to be non-rescuable during a test, the memory test can be aborted. In this manner, it is no longer necessary to waste the testing time, thereby making it possible to reduce the test cost.

Second Embodiment

The second embodiment is directed to a case where there are two or more spare rows (e-fuses) for one rescue unit block.

Figure 9:
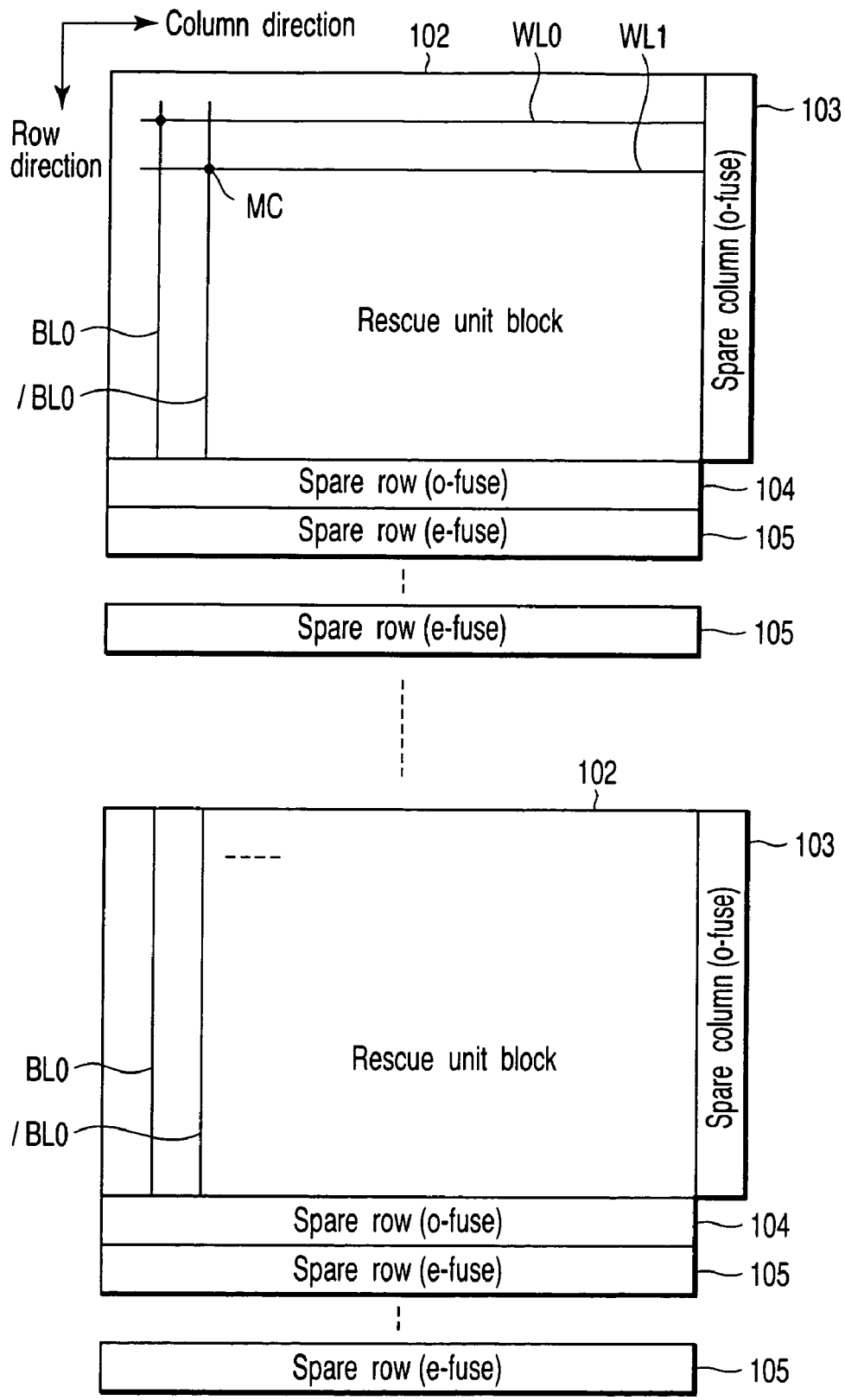
FIG. 9 is a schematic diagram showing the structure of a memory section 100 according to the second embodiment of the present invention.

FIG. 9 is a schematic diagram showing the structure of a memory section 100 according to the second embodiment of the present invention. As shown, each rescue unit block 102 is provided with a plurality of spare rows (e-fuse) 105. A plurality of bit line pairs BL/BL provided for a respective rescue unit block 102 are connected to each spare row (e-fuse) 105.

Figure 10:
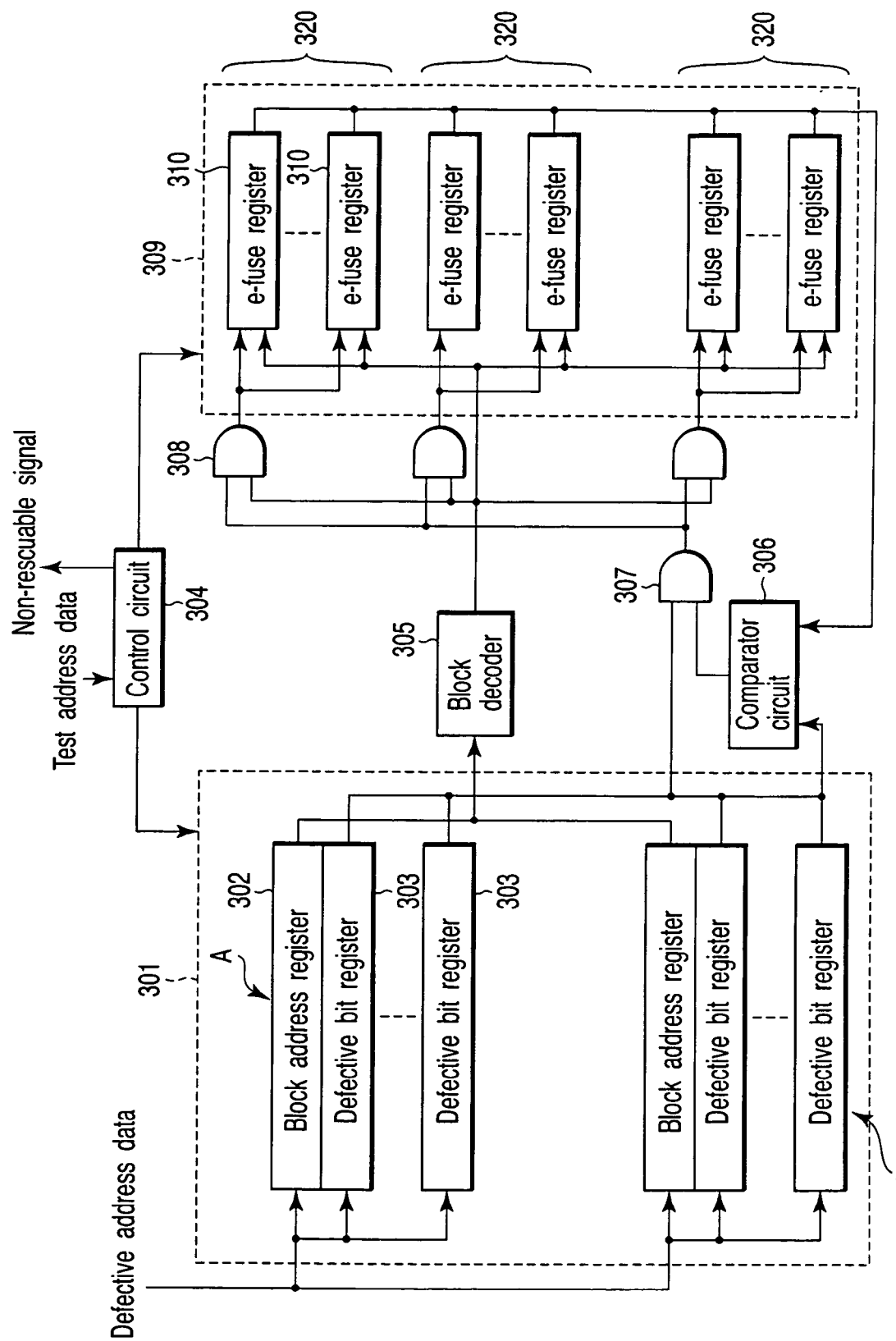
FIG. 10 is a block diagram showing the structure of a defective address storage section 300 according to the second embodiment of the present invention.

FIG. 10 is a block diagram showing the structure of a defective address storage section 300 according to the second embodiment of the present invention. The defective address storage section 300 includes a temporary register 301, a control circuit 304, a block decoder 305, a comparator circuit 306, an AND circuit 307, a plurality of AND circuits 308 and a fuse register 309.

The temporary register 301 includes a temporary register_A and a temporary register_B. The temporary register_A includes a block address register 302 and the same number of defective bit registers 303 as that of the spare rows (e-fuse) 105 of each rescue unit block 102. The temporary register_B has the same structure as that of the temporary register_A.

The fuse register 309 includes a plurality of e-fuse register groups 320, whose number corresponds to that of rescue unit blocks. Each e-fuse register group 320 includes the same number of e-fuse registers 310 as that of spare rows (e-fuse) 105 of each rescue unit block 102. Each fuse register 309 stores a defective row address for each rescue unit block.

The block decoder 305 decodes a block address, and selects an e-fuse register group 320 based on the result of the decoding.

The comparator circuit 306 compares a defective row address stored in the temporary register 301 with a defective row address stored in the e-fuse register 310 of the e-fuse register group 320 corresponding to the defective row address. Then, the circuit 306 judges whether or not the defective row address stored in the temporary register 301 is already present in the e-fuse register 310.

Figure 11:
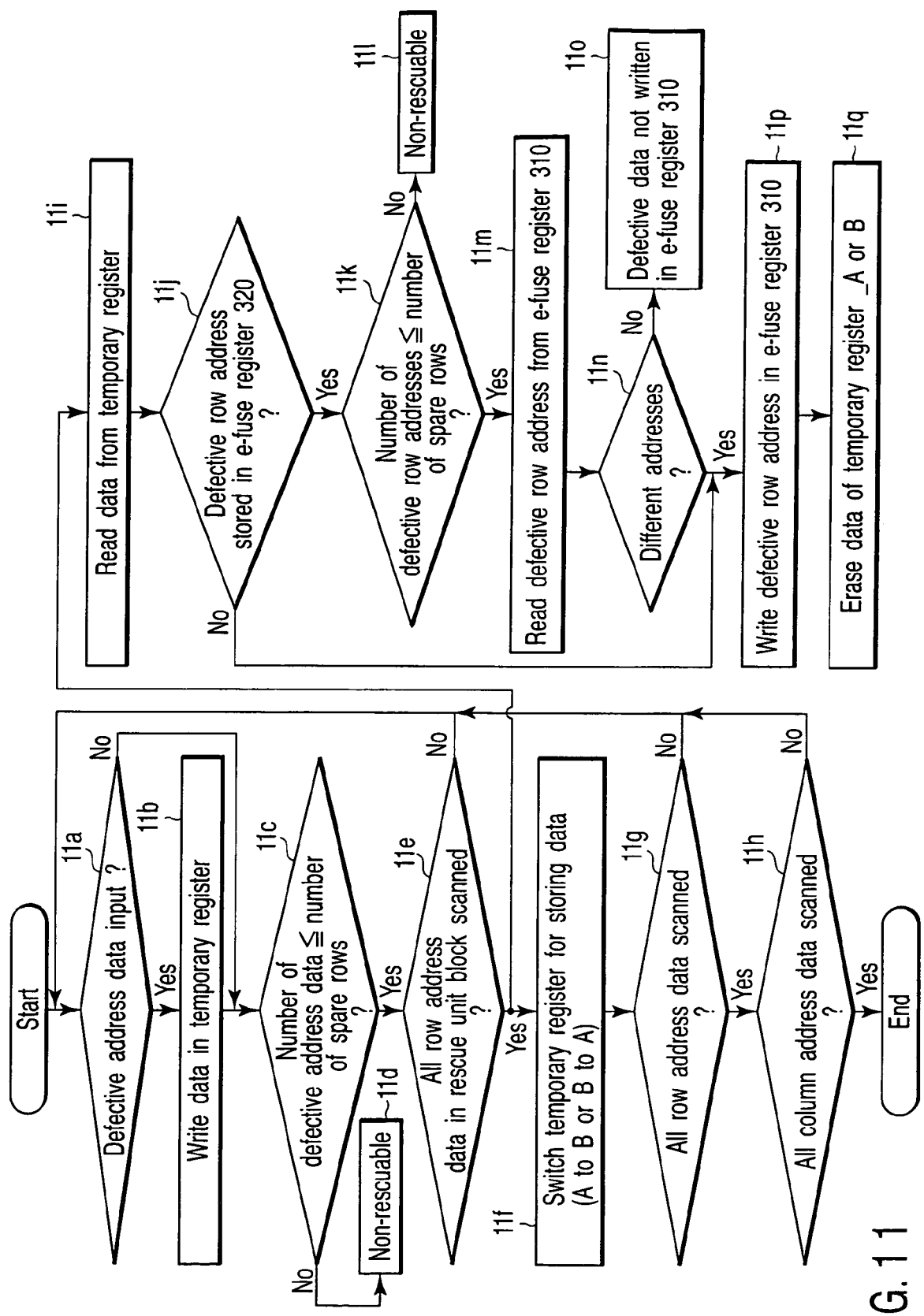
FIG. 11 is a flowchart illustrating the operation of the control circuit 304 in a row first scanning mode, according to the second embodiment of the present invention.

The operation of the semiconductor memory device having the above-described structure will now be described. First, the row first scan mode will be discussed. FIG. 11 is a flowchart illustrating the operation of the control circuit 304 in the row first scanning mode.

The control circuit 304 monitors whether or not defective address data is input from the BIST circuit 200 (step 11a). In the case where defective address data has been input from the BIST circuit 200, the first write circuit 304a writes defective address data in the temporary register_A or the temporary register_B (step 11d).

Next, the rescue judging circuit 304f judges whether or not the number of defective address data input from the BIST circuit 200 is larger than the number of spare rows (e-fuse) 105 of one rescue unit block (step 11c).

In the case where the number of defective address data stored in the respective temporary register is larger than that of the spare rows (e-fuse) 105, the rescue judging circuit 304f judges that the device is not rescuable (step 11d). On the other hand, in the case where the number of defective address data stored in the respective temporary register is the same as or smaller than that of the spare rows (e-fuse) 105, the test address judging circuit 304e judges whether or not all of the test row address data in the rescue unit block in which the error occurred, have been scanned (step 11e).

In the case where not all of the test row address data in the rescue unit block have been scanned, the operation of the control circuit 304 returns to step 11a, where it is monitored whether or not defective address data has been input from the BIST circuit 200. The BIST circuit 200 increments or decrements the test row address data.

In the case where all of the test row address data in the rescue unit block have been scanned, the control circuit 304 switches the temporary register that restores defective address data, from A to B, or B to A (step 11f).

Further, in parallel with the operation of switching the temporary register that stores defective address data to another register, the first read circuit 304c reads the defective address data stored in the temporary register_A or the temporary register_B (step 11i). During this period, the block address stored in the block address register 302 is input to the block decoder 305. The block decoder 305 selects a corresponding e-fuse register group 320 based on the block address.

Next, the data judging circuit 304g judges whether or not defective row address is already stored in the respective e-fuse register group 320 selected by the block decoder 305 (step 11j). In the case where defective address data is not stored, the second write circuit 304b writes defective row address in the e-fuse register 310 (step 11p).

After that, the erase circuit 304h erases the defective address data stored in the temporary register_A or the temporary register_B (step 11q).

In the case where the defective address data is stored in the e-fuse register group 320 in the step 11j, the rescue judging circuit 304f judges whether or not the number of defective address data stored in the e-fuse register group 320 is larger than the number of spare rows (e-fuse) 105 (step 11k). In the case where the number of defective address data is larger than that of the spare rows (e-fuse) 105, the rescue judging circuit 304f judges that the device is not rescuable (step 11i).

On the other hand, in the case where the number of defective address data is the same as or smaller than that of the spare rows (e-fuse) 105, the second read circuit 304d reads the defective row address from the respective e-fuse register 310 (step 11m). The defective row address read from the e-fuse register 310 and the defective row address read from the respective temporary register are compared with each other by the comparator circuit 306.

In the case where the two defective row addresses are different from each other, the second write circuit 304b writes the defective row address read from the temporary register in the e-fuse register 310 (step 11p). On the other hand, in the case where the two defective row addresses are the same as each other, the second write circuit 304b does not write the defective row address read from the temporary register in the e-fuse register 310 (step 11o). The second write circuit 304b carries out the same operation to each of a plurality of defective row address read from the temporary register.

After that, the erase circuit 304h erases the defective address data stored in the temporary register_A or the temporary register_B (step 11q).

Then, the control circuit 304 repeats the above-described operation until all of the test row address data in the memory cell array 101 have been scanned (step 11g). At the same time, the BIST circuit 200 increments or decrements the test row address data.

Further, the control circuit 304 repeats the above-described operation until all of the test column address data have been scanned (step 11h). At the same time, the BIST circuit 200 increments or decrements the test column address data.

Figure 12:
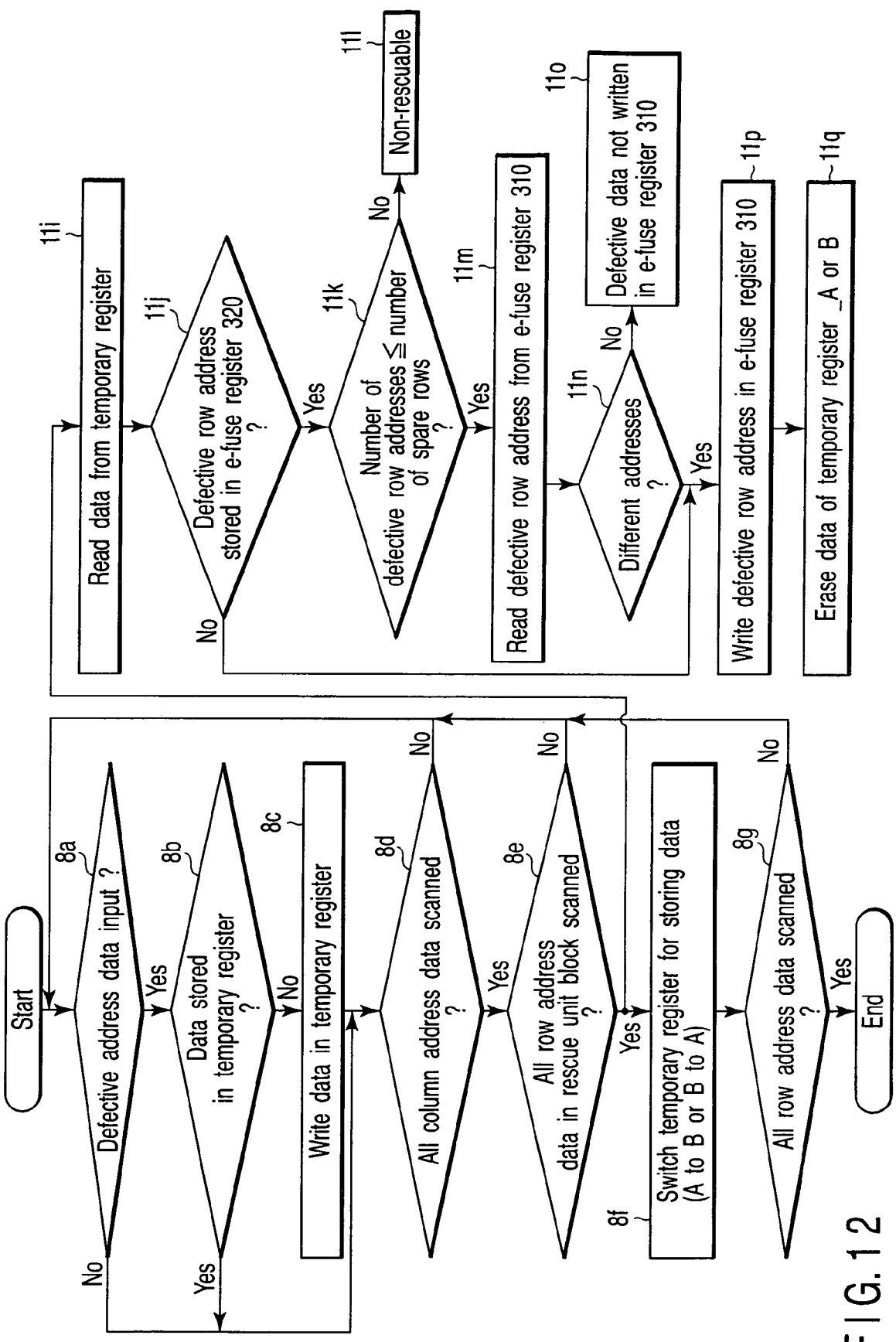
FIG. 12 is a flowchart illustrating the operation of the control circuit 304 in a column first scanning mode according to the second embodiment of the present invention.

Next, the column first scan mode will now be described. FIG. 12 is a flowchart illustrating the operation of the control circuit 304 in the column first scanning mode.

The part of the operation of the control circuit 304 from the inputting of defective address data from the BIST circuit 200 until all the test row address data being scanned, is the same as that of the operation illustrated in FIG. 8. Further, the part of the operation of the control circuit 304 until the writing of the defective address data in the e-fuse register 310 is the same as that of the operation illustrated in FIG. 11.

In this embodiment, there are a plurality of spare rows (e-fuse) 105 for one rescue unit block. Therefore, defective row addresses stored in a temporary register and already-existing defective row address stored in an e-fuse register group 320 need be compared with each other respectively in turn.

However, as compared to that of regular rows, the number of spare rows (e-fuse) 105 is overwhelmingly small. Therefore, the time for comparing a defective row address transferred from a temporary register with an already-existing defective row address stored in an e-fuse register 310, and then writing the address in the e-fuse register 310 falls within the time period in which the memory test is carried out. Consequently, without affecting the operation of the memory test, the comparison and transfer of data between a temporary register and e-fuse register 310 can be carried out.

As described above in detail, according to this embodiment, the same advantage as that of the first embodiment can be obtained even if a plurality of spare rows (e-fuse) 195 are provided for one rescue block.

It is only natural that each of the above-described embodiments can be applied to a redundancy circuit (spare column (e-fuse)) having the same structure as that of one column containing an e-fuse within a rescue unit (, which includes a bit line pair BL,/BL within a rescue unit and a memory cell connected to the bit line pair BL,/BL).

Further, in each of the above-described embodiments, the explanation is made in connection with a DRAM as a semiconductor memory device, but the present invention can naturally be applied to some other memories including flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array including a plurality of memory blocks, each memory block including a plurality of memory cells arranged in matrix;
    a plurality of redundancy sections respectively provided for the plurality of memory blocks and configured to be substituted for defective memory cells;
    a test circuit that carries out a test on the memory cell array and outputs defective addresses;
    first and second registers that temporarily and alternately store the defective addresses;
    a plurality of third registers respectively provided for the plurality of memory blocks, that store the defective addresses; and
    a control circuit that writes a defective address stored in the first register or the second register in the third registers when the defective address stored in the first register or the second register is different from the defective addresses stored in the third registers.

2. The semiconductor memory device according to claim 1, wherein each of the plurality of memory blocks includes a plurality of memory cell lines arranged in a first direction, and
    each of the plurality of redundancy circuits has a same structure as that of one memory cell line.

3. The semiconductor memory device according to claim 2, wherein the test circuit scans the memory cell array along the first direction.

4. The semiconductor memory device according to claim 2, wherein the test circuit scans the memory cell array along a direction orthogonal to the first direction.

5. The semiconductor memory device according to claim 2, wherein each of the defective addresses includes a defective block address indicating an address of a memory block in which an error occurred, and a defective bit address indicating an address of a defective bit.

6. The semiconductor memory device according to claim 5, further comprising a decode circuit that selects a third register corresponding to the memory block based on the defective block address,
    wherein the plurality of third registers store the defective bit address, and
    the control circuit writes the defective bit address in the third register selected by the decode circuit.

7. The semiconductor memory device according to claim 6, wherein the control circuit writes the defective bit address stored in the first register or the second register in the third register selected by the decode circuit when the defective bit address is not stored therein.

8. The semiconductor memory device according to claim 7, further comprising:
a comparator circuit that compares the defective bit address stored in the first register or the second register and a defective bit address stored in the third register with each other to judge whether the two defective bit addresses are the same as each other,
wherein the control circuit refrains from writing the defective bit address in the third register when the two defective bit addresses are judged to be the same as each other by the comparator circuit.

9. The semiconductor memory device according to claim 8, wherein the control circuit judges as non-rescuable when the two defective bit addresses are judged to be different from each other by the comparator circuit and the defective bit address is stored in the third register.

10. The semiconductor memory device according to claim 1, wherein the control circuit erases the defective address stored in the first register or in the second register.

11. The semiconductor memory device according to claim 1, wherein the test circuit includes an address generating circuit that generates test address data.

12. The semiconductor memory device according to claim 1, wherein each of the plurality of memory blocks includes a plurality of memory cell lines arranged along a first direction,
each of the plurality of redundancy sections includes a plurality of redundancy circuits,
each of the plurality of redundancy circuits has a same structure as that of one memory cell line,
the first and second registers respectively includes a plurality of first and second register portions that correspond to the plurality of redundancy circuits, and
each of the plurality of third registers includes a plurality of third register portions that correspond to the plurality of redundancy circuits.

13. The semiconductor memory device according to claim 12, wherein each of the defective addresses includes a defective block address indicating an address of a memory block in which an error occurred, and a defective bit address indicating an address of a defective bit.

14. The semiconductor memory device according to claim 13, further comprising a decode circuit that selects a third register corresponding to the memory block based on the defective block address,
wherein the third register portions store the defective bit address.

15. The semiconductor memory device according to claim 14, wherein the control circuit writes the defective bit address stored in the first register or the second register in the third register selected by the decode circuit when the defective bit address is not stored therein.

16. The semiconductor memory device according to claim 15,
wherein the control circuit writes the defective bit address stored in the first register or the second register in the third register selected by the decode circuit when defective bit addresses are not stored in all of the third register portions.

17. The semiconductor memory device according to claim 16, further comprising:
a comparator circuit that compares the defective bit address stored in the first register or the second register and each defective bit address stored in the third register with each other to judge whether the two defective bit addresses are the same as each other,
wherein the control circuit writes the defective bit address stored in the first register or the second register in the third register when the two defective bit addresses are judged to be different from each other by the comparator circuit.

18. The semiconductor memory device according to claim 17, wherein the control circuit refrains from writing the defective bit address stored in the first register or the second register to the third register when the two defective bit addresses are judged to be the same as each other by the comparator circuit.

19. The semiconductor memory device according to claim 17, wherein the control circuit judges as non-rescuable when the two defective bit addresses are judged to be different from each other by the comparator circuit and the defective bit addresses are judged to be stored in all of the third register portions.

* * * * *